United States Patent
Mehta (10) Patent No.: US 7,078,286 B1
(45) Date of Patent: Jul. 18, 2006

(54) PROCESS FOR FABRICATING A SEMICONDUCTOR DEVICE HAVING ELECTRICALLY ISOLATED LOW VOLTAGE AND HIGH VOLTAGE REGIONS

(75) Inventor: Sunil D. Mehta, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 203 days.

(21) Appl. No.: 10/928,563

(22) Filed: Aug. 27, 2004

Related U.S. Application Data (63) Continuation-in-part of application No. 10/236,114, filed on Sep. 6, 2002, now Pat. No. 6,833,602.

(51) Int. Cl.
*H01L 21/8238* (2006.01)
*H01L 21/76* (2006.01)

(52) U.S. Cl. ............... 438/221; 438/296; 438/424; 438/427

(58) Field of Classification Search ............... 438/221, 438/296, 424, 427, 437
See application file for complete search history.

(56) References Cited

U.S. PATENT DOCUMENTS

| | | | |
|---|---|---|---|
| 5,714,412 A | 2/1998 | Liang et al. | |
| 6,051,467 A | 4/2000 | Chan et al. | |
| 6,171,930 B1 | 1/2001 | Lee et al. | |
| 2002/0024111 A1* | 2/2002 | Shin | 257/500 |
| 2002/0033516 A1 | 3/2002 | Choi et al. | |

OTHER PUBLICATIONS

U.S. Appl. No. 10/236,114, filed Sep. 6, 2002, Mehta et al.

* cited by examiner

*Primary Examiner*—Hsien-Ming Lee (57) ABSTRACT

A process for fabricating a semiconductor device having electrically isolated low voltage and high voltage substrate regions includes low voltage and high voltage trench isolation structures in which a deep portion of the high voltage isolation trench provides electrical isolation in the high voltage regions. The high voltage isolation trench structures include a shallow portion that can be simultaneously formed with the low voltage trench isolation structures. The deep portion of the high voltage isolation trench has a bottom surface and shares a continuous wall surface with the shallow portion that extends from the bottom surface to the principal surface of the substrate. A process for fabricating the device includes the formation of sidewall spacers to define a minimum isolation width between adjacent high voltage nodes.

20 Claims, 11 Drawing Sheets

PROCESS FOR FABRICATING A SEMICONDUCTOR DEVICE HAVING ELECTRICALLY ISOLATED LOW VOLTAGE AND HIGH VOLTAGE REGIONS

RELATED APPLICATION

The application is a continuation-in-part of commonly-assigned patent application Ser. No. 10/236,114, filed Sep. 6, 2002 now U.S. Pat. No. 6,833,602, the disclosure of which is incorporated by reference herein.

TECHNICAL FIELD

The present invention relates, in general, to semiconductor devices having low voltage and high voltage transistors and to processes for device fabrication and, more particularly, to electrical isolation for electrically-erasable-programmable-read-only-memory (EEPROM) devices and to process for fabricating electrical isolation structures.

BACKGROUND

Non-volatile memory devices are both electrically erasable and programmable. Such devices retain data even after the power to the device is terminated. One particular type of non-volatile memory device is the (electrically-erasable-programmable-read-only-memory) EEPROM device. In an EEPROM device, programming and erasing is accomplished by transferring electrons to and from a floating-gate electrode through a thin dielectric layer, known as a tunnel-oxide layer, located between the floating-gate electrode and the underlying substrate.

To program EEPROMs with a programmable logic device (PLD), a high voltage Vpp+ is applied to the gate electrode of the write transistor and a relatively lower voltage Vpp is applied to the drain (bit line contact) of the write transistor. The voltage applied to the write transistor gate electrode turns the write transistor on allowing the voltage applied to the bit line to be transferred to the source of the write transistor. The application of such high voltage levels is a write condition that results in a net positive charge being stored in the EEPROM cell.

To erase the EEPROM cell, a voltage Vcc is applied to the gate of the write transistor and ground potential is applied to the bit line and a high voltage Vpp+ is applied to the programming region. Under this bias condition, the high voltage applied to programming region is coupled to the floating-gate electrode and the EEPROM cell is erased by the transfer of electrons from the substrate to the floating-gate electrode.

The voltages required for programming and erasing of the EEPROM cell require charge pumping circuitry to generate the high voltages. In addition to charge pumping circuitry, other high voltage circuit elements include cell transistors, such as program transistors and sense transistors. An EEPROM cell includes low voltage circuitry, such as read transistors and logic transistor. As in other types of devices, electrical isolation is necessary to electrically isolate various transistors in the device. In particular, it is necessary to electrically isolate the high voltage elements from the low voltage elements. Typically, low voltage devices require less robust isolation than high voltage devices.

To conserve valuable substrate area, the electrical isolation structure is fabricated by first forming a trench formed in the substrate. The trench is then filled with an electrically insulating material, such as silicon dioxide. The trench isolation runs between selected regions of the substrate containing, for example, the charge pumping circuitry and the EEPROM cells. The trench isolation also electrically separates active areas within the EEPROM cells. To adequately electrically isolate the high voltage devices, the trench needs to have a depth that is sufficient to contain a large amount of silicon dioxide. Conversely, only a relatively shallow trench is necessary to electrically isolate the low voltage devices. Simply making all of the isolation sufficient for the high voltage devices, however, consumes more substrate area than necessary. More compact, high-density device structures could be fabricated if an efficient method existed for fabricating trench isolation regions that were not excessively deep for isolation of low voltage device elements.

SUMMARY

The present invention relates to a process for fabricating a semiconductor device having high voltage device elements and low voltage device elements. Although the invention is particularly suited to the fabrication of EEPROM devices, the electrical isolation structure and fabrication process of the invention can be used for any semiconductor device that includes high voltage and low voltage device elements.

In accordance with one embodiment of the invention, a process for fabricating a memory device having high voltage regions and low voltage regions in a semiconductor substrate includes forming trenches in the high voltage regions and in the low voltage regions. Dielectric sidewall spacers are formed in the trenches in the high voltage regions and a masking layer is formed to overlie the substrate. The masking layer selectively exposes trenches residing between adjacent high voltage nodes in a high voltage region. Deep portions are etched in the exposed trenches using the sidewall spacers as an etching mask. The masking layer and the sidewall spacers are removed and the trenches are filled with an insulating material.

In accordance with another embodiment of the invention, a process for fabricating isolation trenches in a substrate of a semiconductor device includes forming, in the same process step, a shallow portion of the trenches in a low voltage region and in a high voltage region of sufficient depth to isolate the low voltage region, but not of sufficient depth to isolate the high voltage region. Sidewall spacers are formed adjacent to sidewalls of the shallow portion in the high voltage region. A mask is formed on the substrate that selectively exposes areas of the high voltage region having adjacent high voltage nodes. The shallow portion is etched using the sidewall spacers as an etch mask to form a deep portion of sufficient depth to electrically isolate the adjacent high voltage nodes.

In yet another embodiment of the invention, a process for fabricating a semiconductor device includes providing a substrate having a principal surface and having low voltage regions and high voltage regions. The substrate is etched to form recesses in the low voltage regions and in the high voltage regions, where the recesses have sidewalls extending from a floor to the principal surface. Sidewall spacers are formed adjacent to the sidewalls of the recesses and the sidewall spacer expose a portion of the floor that substantially corresponds to an isolation width between adjacent high voltage regions. The substrate is masked to cover the low voltage regions and to expose selected portions of the high voltage regions. The recesses are etched in the high voltage region to form a deep portion in the floor using the sidewall spacers as an etch mask. The sidewall spacers are removed and a dielectric liner is formed in the recesses. The recesses are then filled with an electrical insulating material to form low voltage isolation regions and high voltage isolation regons.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Figure 1:
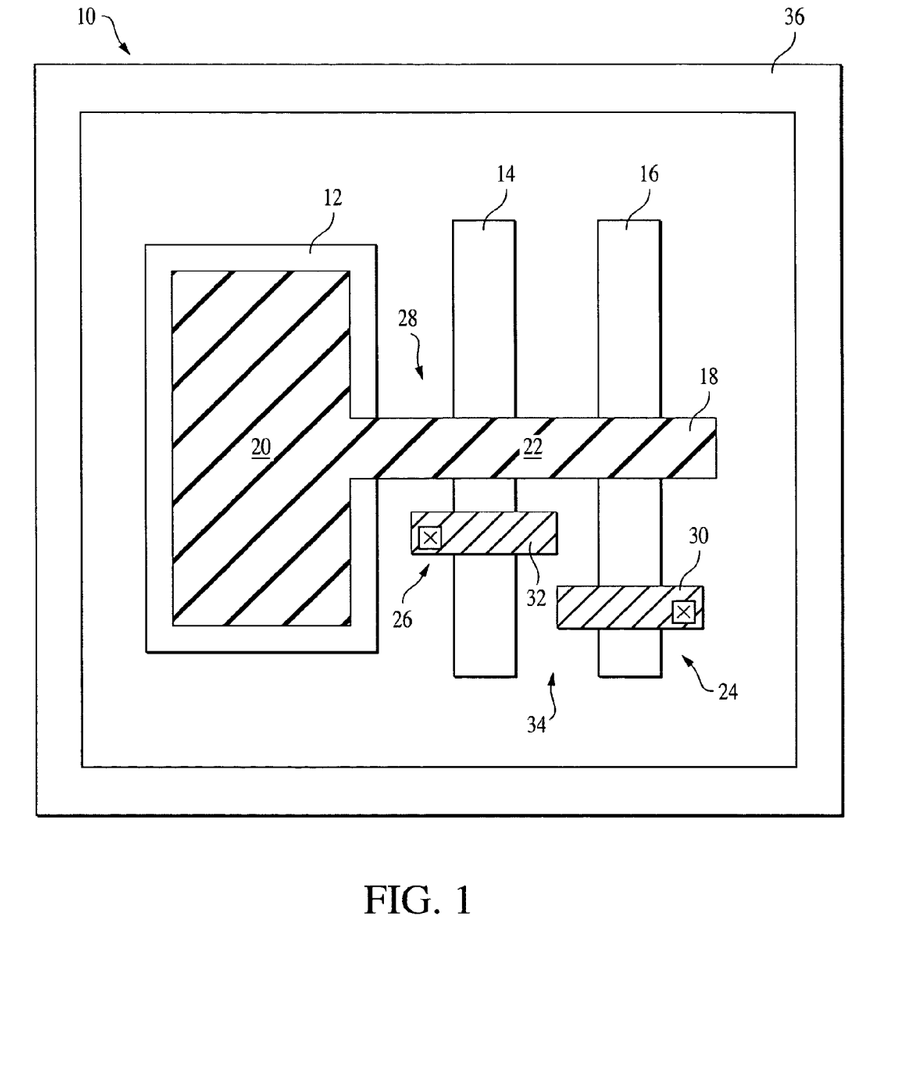
FIG. 1 illustrates a top view of an EEPROM memory cell arranged in accordance with one embodiment of the invention.

A top view of an EEPROM device 10 arranged and in accordance with one embodiment of the invention is illustrated in FIG. 1. EEPROM device 10 includes three active substrate regions, a programming region 12, a sensing region 14, and a tunnel region 16. A floating-gate electrode 18 includes a capacitor portion 20 overlying programming region 12 and a gate portion 22 overlying sensing region 14 and a tunnel region 16. Device 10 also includes a write transistor 24, a read transistor 26, and a sense transistor 28. Write transistor 24 is formed where a gate electrode 30 overlies tunnel region 16. Read transistor 26 is formed where a gate electrode 32 overlies sensing region 14 and sense transistor 28 is formed where gate portion 22 overlies sensing region 14. Electrons are transferred to and from floating-gate electrode 18 where gate portion 22 overlies tunnel region 16.

In the operation of EEPROM device 10, high voltages, such as about 10 volts to about 12 volts are applied to floating-gate electrode 18 and to programming region 12 and to tunnel region 16. Accordingly, these devices require more extensive electrical isolation than other devices, such as read transistor 26 and logic transistors (not shown). Further, charge pumping circuitry (not shown) resides on the same substrate as EEPROM device 10, but is fabricated in locations remote from EEPROM device 10. For proper operation, programming region 12, sensing region 14, and tunnel region 16 must be electrically isolated from one another. Typically, regions 12, 14, and 16 are formed by doping the substrate with a conductivity-determining dopant. In the case where the active EEPROM devices are N-type devices, dopants such as arsenic, phosphorus, and the like are used to form regions 12, 14, and 16. Typically, these regions are formed in a P-type substrate.

Electrical isolation is necessary to prevent unwanted electrical current from flowing between the various active regions within the substrate. For example, trench isolation structures, generally depicted as element 34 in FIG. 1, are positioned between the active regions in order to electrically isolate each active region. Further, an electrical isolation 36 is provided around the periphery of EEPROM device 10 in order to electrically isolate the device from peripheral charge pumping circuitry. Those skilled in the art will appreciate that electrical isolation structures will reside in many regions of a semiconductor substrate to provide electrical isolation between adjacent active regions. As described above, the high voltage regions require more extensive electrical isolation than the low voltage regions. Accordingly, the present invention provides a structure and process for providing a varying degree of electrical isolation by varying the depth of a trench isolation structure formed in the substrate supporting EEPROM device 10.

Those skilled in the art will recognize that numerous variations are possible for the component arrangement in an EEPROM device. Accordingly, the particular arrangement illustrated in FIG. 1 is but one of many possible arrangements for an EEPROM device. Further, although the device and process of the invention will be described with respect to an N-type device, those skilled in the art will recognize that the conductivity of all regions can be reversed to provide a P-type device.

Figure 2:
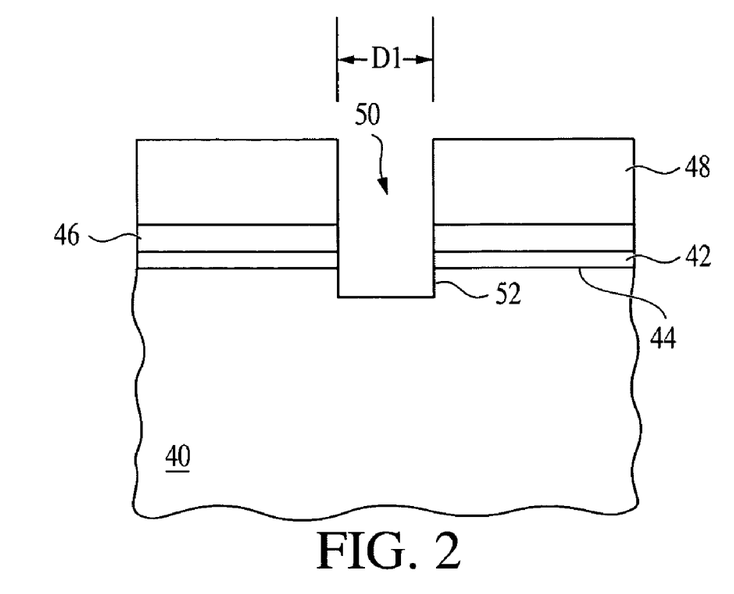
FIGS. 2–4 illustrate, in cross-section, processing steps for fabricating a trench structure in a substrate in accordance with one embodiment of the invention.

FIGS. 2–5 illustrate, in cross-section, a process for fabricating a trench structure in accordance with one embodiment of the invention. FIG. 2 illustrates a portion of a semiconductor substrate 40 having already undergone several processing steps in accordance with a first process embodiment. A pad oxide 42 overlies a principal surface 44 of substrate 40. A hard mask layer 46 overlies pad oxide layer 42. Hard mask layer 46 can be any of a number of materials that can resist thermal oxidation and offer etching resistance to a silicon etch. In a preferred embodiment, hard mask 46 is silicon nitride. A resist pattern 48 is formed to overlie hard mask 46. Resist pattern 48 includes an opening 50 having a lateral dimension D1. In accordance with the first embodiment of the invention, opening 50 has a lateral dimension substantially the same as the intended lateral dimension of the deep portion of the isolation trench.

Resist pattern 48 is a high voltage masking pattern that selectively defines regions of substrate 40 in which a deep trench is to be formed for the electrical isolation of high voltage transistors in substrate 40. In accordance with the invention, the lateral dimension D1 is constant across all regions of the substrate in which a deep trench is to be formed. Resist pattern 48 only exposes regions of substrate 40 where a high voltage isolation trench is to be formed. Regions that are to have a low voltage isolation trench are protected by resist pattern 48.

To begin the formation of a high voltage isolation trench in substrate 40, an etching process is carried out using resist pattern 48 as an etching mask. Preferably, substrate 40 is anisotropically etched, such that a recess 52 is formed in substrate 40. The etching process is carried out to form recess 52 in substrate 40 to a depth of about 500 angstroms to about 3000 angstroms. In accordance with a preferred embodiment of the invention, where substrate 40 is a silicon substrate, a reactive-ion-etch (RIE) process is carried out using chlorinated etching gases. Alternatively, other types of plasma etching techniques can be used, such as electron-cyclotron-resonance (ECR) etching, reactive sputter etching, and the like.

Figure 3:
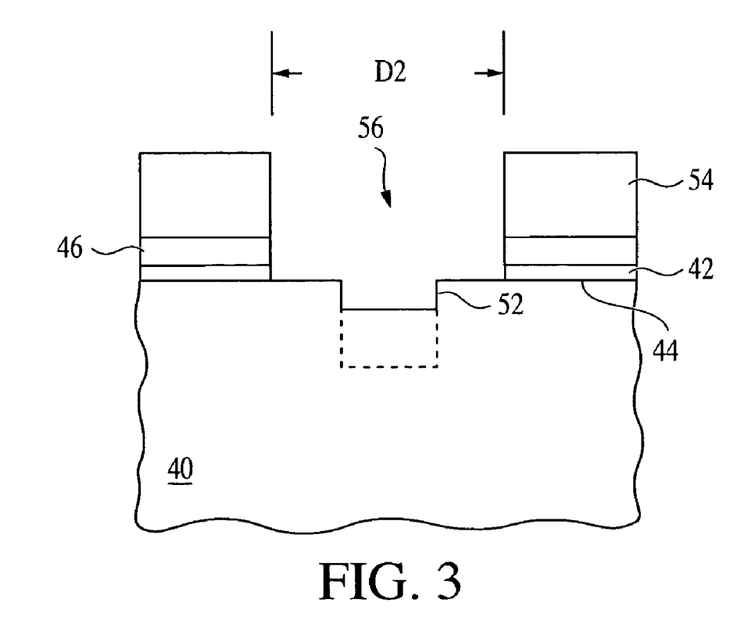

After forming recess 52, resist pattern 48 is removed and another resist pattern 54 is formed, as illustrated in FIG. 3. Resist pattern 54 includes an opening 56. As indicated by comparison between FIGS. 2 and 3, opening 56 has a lateral dimension that is greater than the corresponding lateral dimension of opening 50. Resist pattern 54 is an active area mask that is generally used to define the low voltage isolation regions for the active areas of substrate 40. Accordingly, resist pattern 54 is a general mask pattern that is used to pattern isolation structures for all low voltage active areas of substrate 40.

Figure 4:
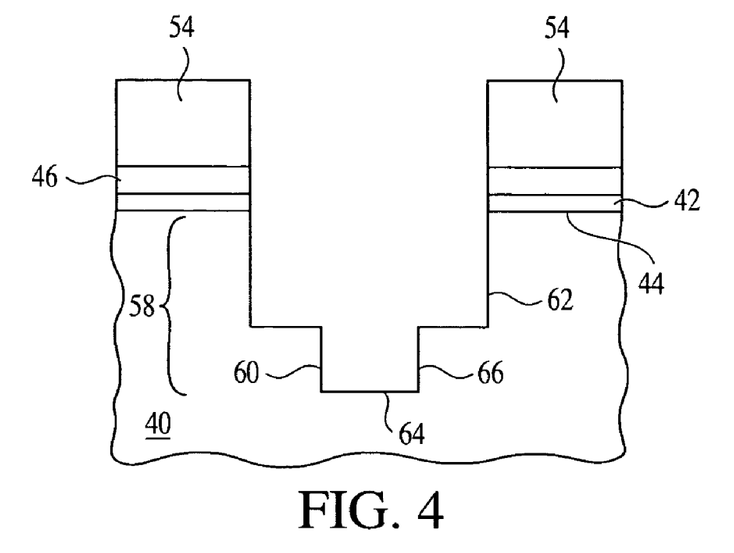

Once resist pattern 54 is in place, an etching process is carried out, as illustrated in FIGS. 3 and 4 to continue to form a trench structure in substrate 40. The etching process is carried out using resist pattern 54 as an etching mask, such that a high voltage isolation trench 58 is formed in substrate 40. As described above, since resist pattern 54 contains a low voltage isolation pattern, the pattern contains all low voltage trench structures as well as the high voltage trench structures. The etching process simultaneously forms the low voltage isolation trenches as well as a portion of the high voltage isolation trench structures. Initially, as illustrated in FIG. 3, the portions of pad oxide 42 and hard mask 46 exposed by opening 56 are etched away. Once the exposed portions of pad oxide 42 and hard mask 46 are removed, as illustrated in FIG. 4 the etching process continues to etch into principal surface 44 and to remove portions of substrate 40. During this etching process, recess 52 is made deeper in substrate 40.

Upon completion of the etch process, trench 58 includes a deep portion 60 and a shallow portion 62. Deep portion 60 includes a bottom surface 64 and a wall surface 66. Wall surface 66 is continuous in both deep portion 60 and shallow portion 62, and extends from bottom surface 64 to principal surface 44. In addition to providing a portion of the high voltage isolation trench structures, shallow portion 62 also forms the low voltage isolation trenches in low voltage regions of substrate 40 (not shown).

As shown by the dotted line in FIG. 3, during formation of high voltage isolation trench 58, the etching process continues to etch recess 52 into substrate 40, while simultaneously etching portions of principal surface 44 exposed by opening 56. Accordingly, the etching process sinks deep portion 60 further into substrate 40, while also forming shallow portion 62. In accordance with the preferred embodiment of the invention, the same etching process is used to form shallow portion 62 that was previously used to form recess 52. Upon completion of the etching process the bottom surface or ledge of shallow portion 62 preferably resides no more than about 3000 angstroms from principal surface 44, and bottom surface 64 of deep portion 60 preferably resides at least about 4000 angstroms from principal surface 44.

Although a specific preferred depth of deep portion 60 and shallow portion 62 is described, those skilled in the art will appreciate that high voltage isolation trench 58 can have regions formed to other depths. Further, although only two portions having different depths are illustrated, the trench can be fabricated to have several regions of differing depth in substrate 40. The specific depth, as well as the relative depth of the different portions of trench high voltage isolation 58, will depend upon several factors, such as the type of semiconductor device, the conductivity of the active elements, the junction depth of the active elements, and the like.

Figure 5:
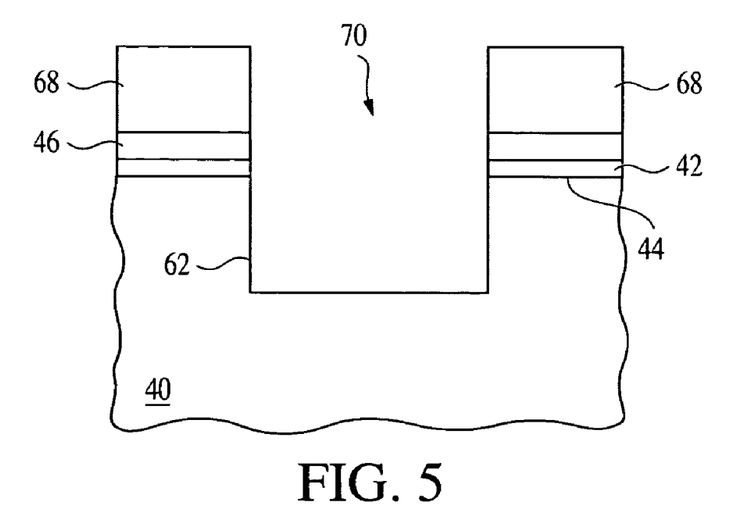
FIGS. 5–6 illustrate, in cross-section, processing steps for fabricating a trench structure in accordance with another embodiment of the invention.
Figure 6:
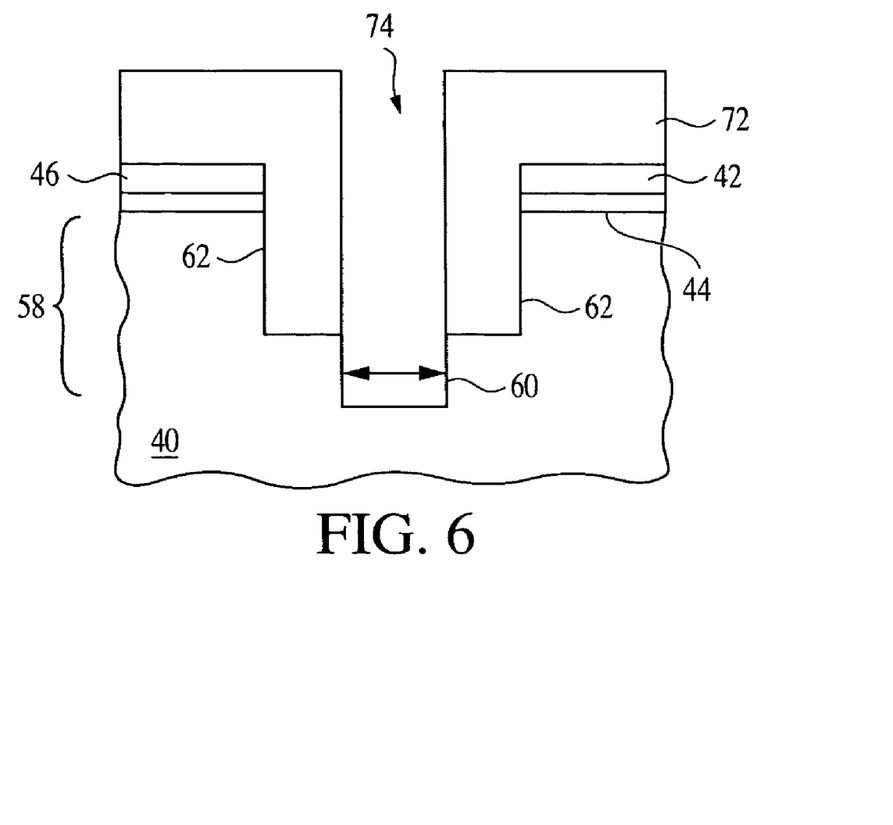

An alternative method for fabricating high voltage isolation trench 58 is illustrated in FIGS. 5–6. In accordance with the alternative embodiment, a resist pattern 68 is formed to overlie hard mask 46. Resist pattern 68 includes an opening 70 that will define the active trench isolation region for low-voltage devices fabricated in substrate 40. Accordingly, resist pattern 68 is substantially the same as resist pattern 54 illustrated in FIG. 3. In accordance with the alternative embodiment, a first etching process is carried out to form shallow portion 62 of trench 58. Then, as illustrated in FIG. 6, a resist pattern 72 is formed to overlie substrate 40. Resist pattern 72 includes an opening 74. Opening 74 defines the lateral dimension of deep portion 60 of trench 58.

Once resist pattern 72 is in place, a second etching process is carried out to form deep portion 60 in substrate 40. In similarity with the previous embodiment, opening 74 is substantially the same as the intended lateral dimension of deep portion 60. The lateral dimension is substantially the same across all regions of the substrate in which a deep trench is formed. Also, in accordance with a preferred embodiment, the first and second etching processes combine to create a shallow portion having a depth of no more than about 3000 angstroms and a deep portion having a depth of at least about 4000 angstroms. After completing the second etching process, resist pattern 72 is removed.

Figure 7:
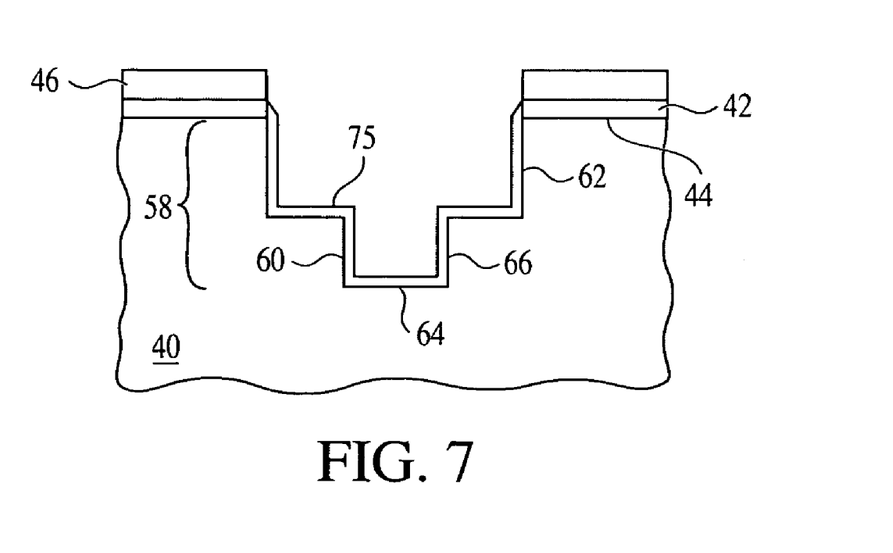
FIGS. 7–9 illustrate, in cross-section, further processing steps in accordance with the invention to complete the fabrication of a trench isolation structure.

Regardless of the particular etching sequence used, upon completion of the etching process a dielectric liner 75 is formed to overlie bottom surface 64 and wall surface 66 of high voltage isolation trench 58, as illustrated in FIG. 7. Preferably, dielectric liner 75 is formed by thermally oxidizing substrate 40 to form a silicon dioxide layer overlying the exposed surface of high voltage isolation trench 58. Hard mask 46 prevents the further oxidation of principal surface 44, such that the thickness of pad oxide layer 42 is not increased during the oxidation process. In an alternative embodiment, dielectric liner 75 can be formed by the deposition of a dielectric material, such as the chemical-vapor-deposition (CVD) of a dielectric material, such as silicon nitride, and the like.

Figure 8:
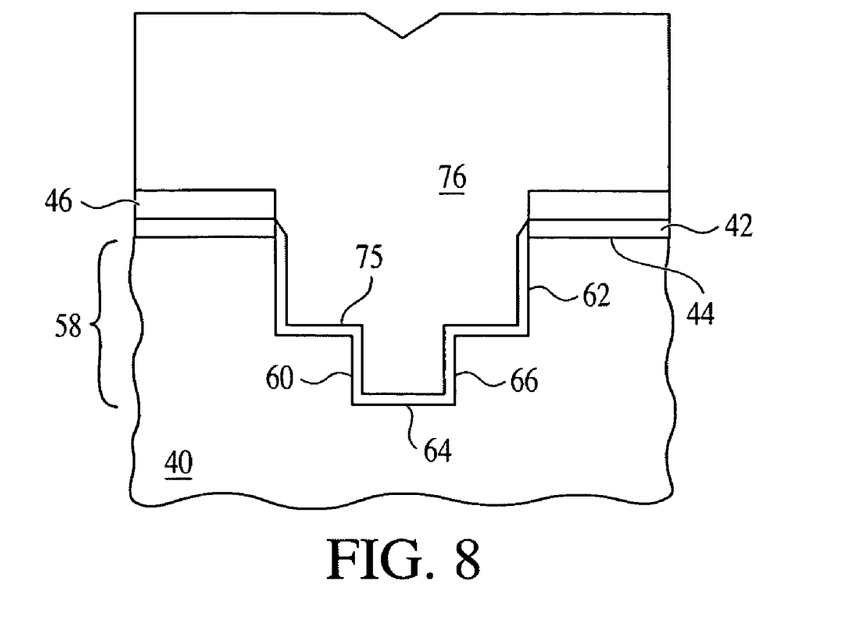

After forming dielectric liner 75, an insulating material 76 is deposited to fill high voltage isolation trench 58, as illustrated in FIG. 8. Insulating material 76 can be any of a number of electrically insulating materials, such as silicon dioxide, silicon nitride, a ceramic material, and the like. In a preferred embodiment, insulating material 76 is silicon dioxide formed by CVD using tetraethylorthosilane (TEOS) source gas. When using TEOS source gas, the CVD process can be carried out at a relatively low pressure, or alternatively at atmospheric pressure.

Figure 9:
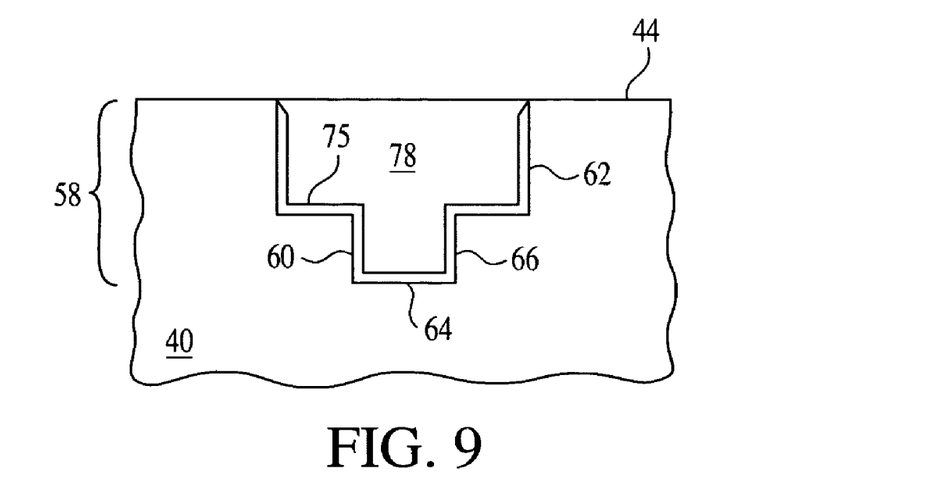

Referring to FIG. 9, once insulating material 76 is deposited, a planarization process is carried out to remove excess portions of insulating material 76 and hard mask 46. The planarization process forms an isolation region 78 in high voltage isolation trench 58. Preferably, the planarization process is carried out by a chemical-mechanical-polishing (CMP) process. The CMP process removes excess portions of insulating material 76 and forms a smooth surface that is continuous with principal surface 44. The CMP process also removes hard mask 46 and pad oxide 42.

In accordance with the invention, deep portion 60 is only formed in regions of substrate 40 that require electrical isolation between high voltage devices, or regions of substrate 40 containing high voltage devices. Accordingly, in regions of substrate 40 that are populated by low voltage devices, high voltage isolation trench 58 only includes shallow portion 62 and not deep portion 60. Those skilled in the art will appreciate that processing efficiency is obtained by the fabrication of an isolation trench having a varying depth using only two resist patterns. In particular, the low voltage and high voltage isolation trenches are formed with the addition of only one extra masking step. This is because the active isolation mask is used regardless of whether or not additional processing steps are provided for the electrical isolation of high voltage devices.

In a further aspect of the invention, the deep portion 60 of high voltage isolation trench 58 is fabricated to have substantially the same width in the high voltage regions of substrate 40. By maintaining substantially the same width at all locations in the device, an extra masking step during the planarization process is avoided. Those skilled in the art will appreciate that, in processes of the prior art, a separate mask was necessary to account for variations in the trench width in order to prevent the dishing phenomena during device CMP processing. In the process of the present invention, a reverse planarization mask is unnecessary since there are no wide trench areas that need to be protected to prevent dishing during the CMP process.

In accordance with an alternative embodiment of the invention, an isolation structure having high voltage and low voltage electrical isolation structures will now be described. Shown in FIG. 10 in cross-section, is a semi-conductor substrate 80 having already undergone several processing steps in accordance with the alternative embodiment of the invention. Substrate 80 includes a first trench 82 and a second trench 84. First and second trenches 82 and 84 are preferably formed in substrate 80 by an anisotropic etching process. In the fabrication process, a pad oxide layer 86 is formed over a principle surface 88 of substrate 80. A hard mask layer 90 is then formed to overlie pad oxide layer 86. To define the areas of substrate 80 to be etched, a resist pattern (not shown) is formed to overlie hard mask layer 90. The anisotropic etching process is then carried out to form first and second trenches 82 and 84. In a preferred embodiment, the etching process is an RIE process. Once the etching process is complete, the resist mask is removed and a layer 92 of sidewall spacer-forming material is conformally deposited to overlie substrate 80.

Figure 10:
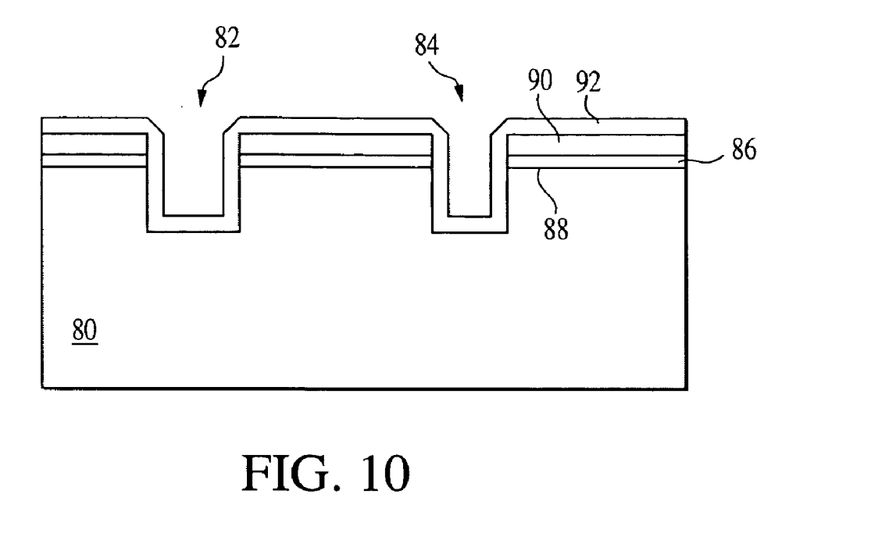
FIGS. 10–12 illustrate, in cross-section, processing steps for fabricating a deep portion of a trench structure in a substrate in accordance with an alternative embodiment of the invention.

Those skilled in the art will appreciate that a variety of materials can be used to form the layers illustrated in FIG. 10. For example, substrate 80 can be a single crystal silicon substrate, or alternatively, an epitaxial silicon substrate, a silicon-on-insulator (SOI) substrate, or the like. Further, substrate 80 can be a germanium or III–V semiconductor material, or the like. Where substrate 80 contains silicon, pad oxide layer 86 can be a silicon-oxide layer formed by the thermal oxidation of substrate 80. Hard mask layer 90 is preferably a dielectric material such as silicon nitride, however, in similarity to earlier embodiments, hard mask layer 90 can be any of a number of materials that resist thermal oxidation and offer etching resistance to a silicon etchant. Layer 92 can be any sidewall spacer forming material that can be conformally deposited. Further, layer 92 is preferably a dielectric material that is differentially etchable with respect to hard mask layer 90. Where hard mask layer 90 is a silicon nitride material, for example, layer 92 is preferably a silicon oxide material deposited by a CVD process.

Figure 11:
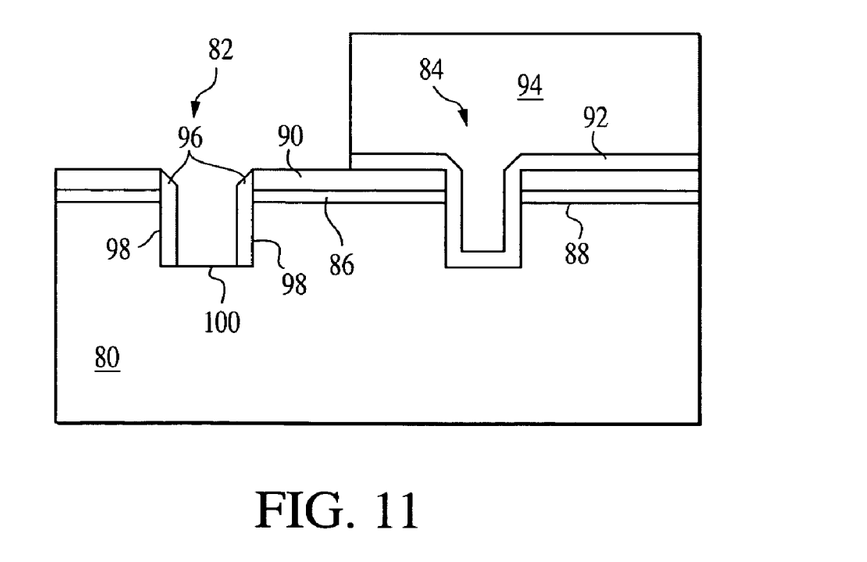

After forming layer 92, a resist mask 94 is formed to overlie layer 92, as illustrated in FIG. 11. An etching process is then carried out to remove portions of layer 92 exposed by resist mask 94. In a preferred embodiment, an RIE process is carried out to anisotropically etch layer 92. In similarity to the previous described anisotropic etching processes, the RIE process is a directional process that removes material from horizontal surfaces many times more rapidly than from vertical surfaces. Accordingly, while the anisotropic etching process removes portions of layer 92 overlying horizontal surfaces, the etching process leaves sidewall spacers 96 on sidewalls 98 of first trench 82. In the embodiment where layer 92 is a silicon oxide material, the RIE process uses fluorine-based etching gases to etch away portions of layer 92 overlying horizontal surfaces. The etching process also removes portions of layer 92 overlying bottom surface 100 of first trench 82. In accordance with the alternative embodiment of the invention, the etching process used to form sidewall spacers 96 is selective to the material of substrate 80. Accordingly, the etching process removes portions of layer 92 overlying bottom surface 100 without appreciably etching substrate 80 at bottom surface 100.

Figure 12:
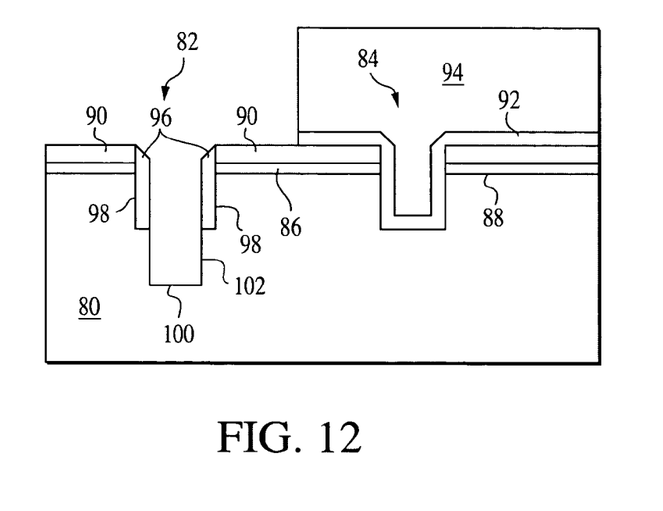

After forming sidewall spacers 96, a second etching process is carried out to increase the depth of first trench 82. As illustrated in FIG. 12, the etching process etches bottom surface 100 of first trench 82 using sidewall spacers 96 as an etch mask to form a deep portion 102. In accordance with the invention, deep portion 102 is formed in substrate 80 to a predetermined depth below sidewall spacers 96. The particular overall depth of first trench 82 following the second etching process will depend upon the particular electrical characteristics of the memory device elements to be formed in substrate 80 and the degree of electrical isolation that is required.

In accordance with an alternative embodiment, the second etching process can be carried out after removing resist mask 94. In the alternative embodiment, the second etching process is selective to both the materials of hard mask layer 90 and layer 92. In the embodiment where substrate 80 is a silicon material and layers 90 and 92 are dielectric materials, deep portion 102 is formed by an RIE etching process using chlorine-based etching compounds.

Figure 13:
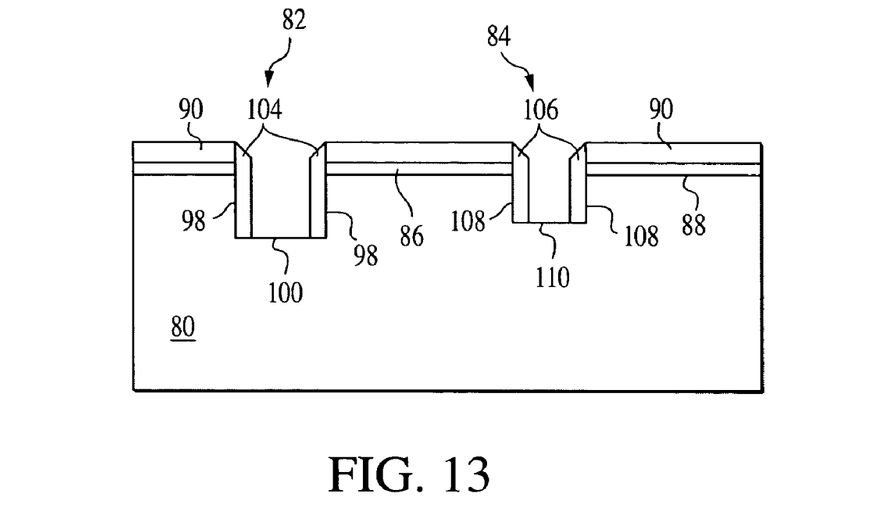
FIGS. 13–14 illustrate, in cross-section, a variation in processing steps for fabricating the deep portion of the trench structure the alternative embodiment of the invention.
Figure 14:
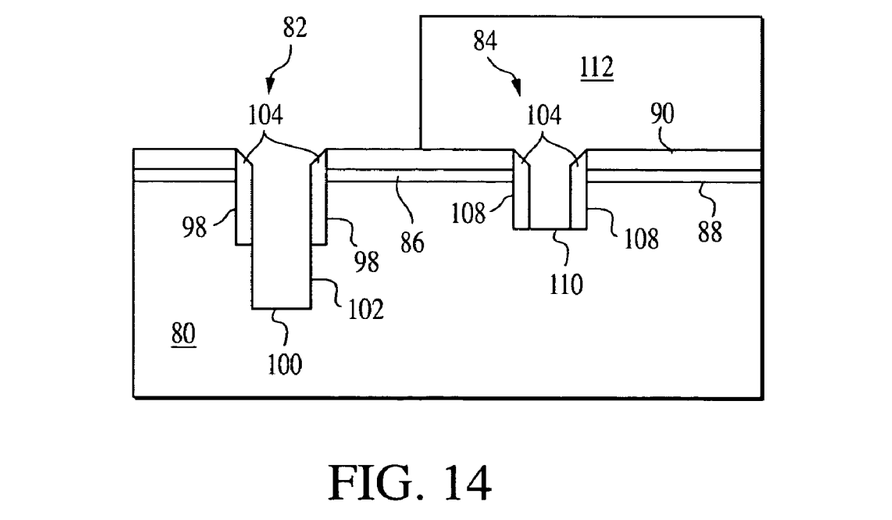

An alternative process for forming deep portion 102 in substrate 80 is illustrated in FIGS. 13 and 14. In accordance with the alternative embodiment, after depositing sidewall spacer forming layer 92, as illustrated in FIG. 10, layer 92 is anisotropically etched to form sidewall spacers 104 in first trench 82 and sidewall spacers 106 in second trench 84. The etching process is substantially the same as that previously described for the formation of sidewall spacers 96. In the alternative embodiment, the etching process removes portions of layer 92 overlying the horizontal surfaces of substrate 80, while leaving sidewall spacers 104 adjacent to vertical surfaces 98 of first trench 82 and vertical surfaces 108 of second trench 84. The etching process also removes portions of layer 92 overlying a bottom surface 110 of second trench 84.

Once sidewall spacers 104 and 106 are formed, a resist mask 112 is formed, as illustrated in FIG. 14. After forming resist mask 112, a second etching process is carried out to form deep portion 102 in first trench 82. The etching process is substantially the same as that previously described.

Figure 15:
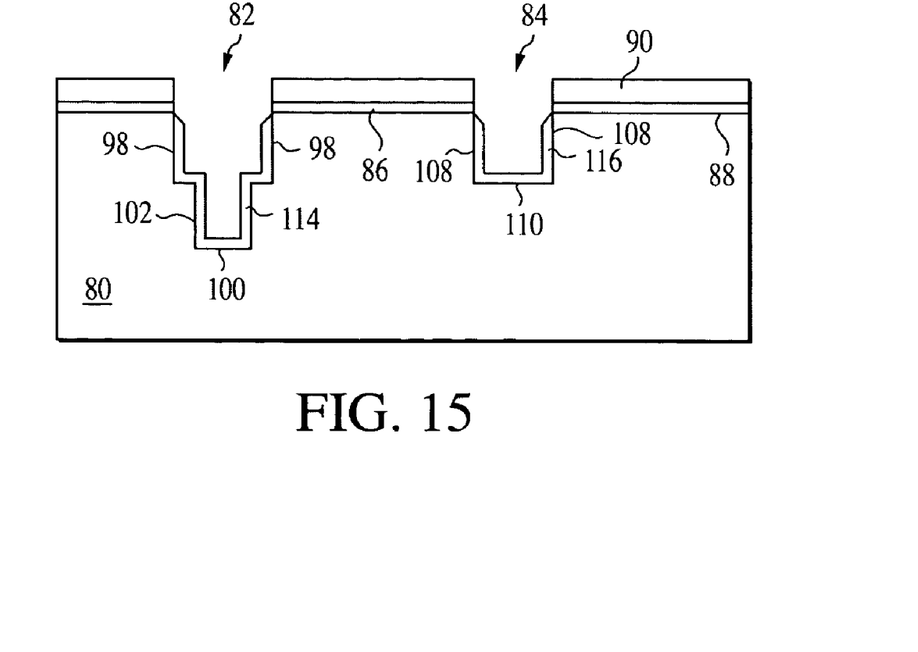
FIGS. 15–18 illustrate, in cross-section, further processing steps for completing the trench structure in accordance with the alternative embodiment.

Referring to FIG. 15, after forming deep portion 102 in substrate 80, subsequent processing steps are carried out to form liners 114 and 116 in first and second trenches 82 and 84, respectively. The liner forming process is substantially the same as that previously described and illustrated in FIG. 7.

Figure 16:
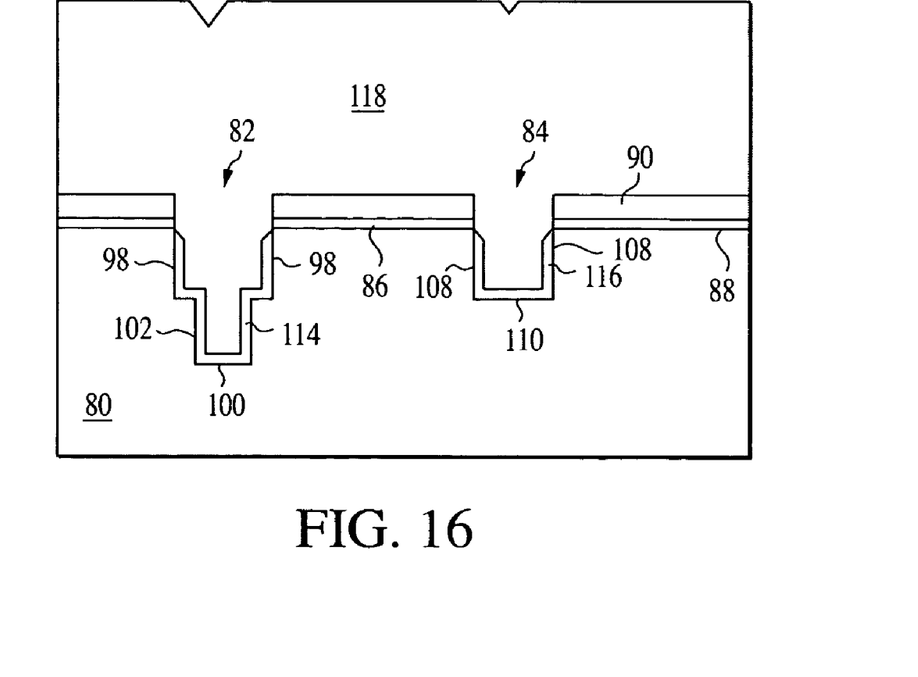

In accordance with the previous embodiment illustrated in FIGS. 8–9, after forming liners 114 and 116, an insulating material 118 is deposited to fill first and second trenches 82 and 84, as illustrated in FIG. 16. Insulating material 118 is substantially the same as previously-described insulating material 76.

Figure 17:
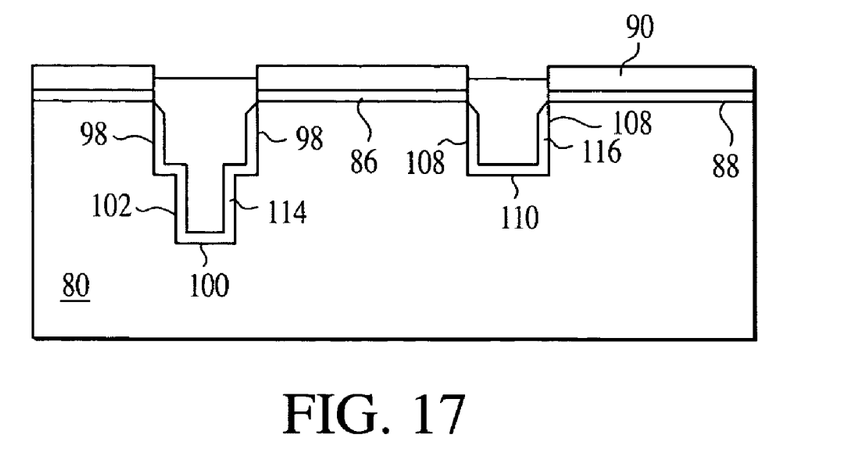

After depositing insulating material 118, a planarization process is carried out to remove portions of insulating material 118 overlying mask layer 90, as illustrated in FIG. 17. Preferably, the planarization process is substantially the same as that previously described for the planarization of insulating material 76.

Figure 18:
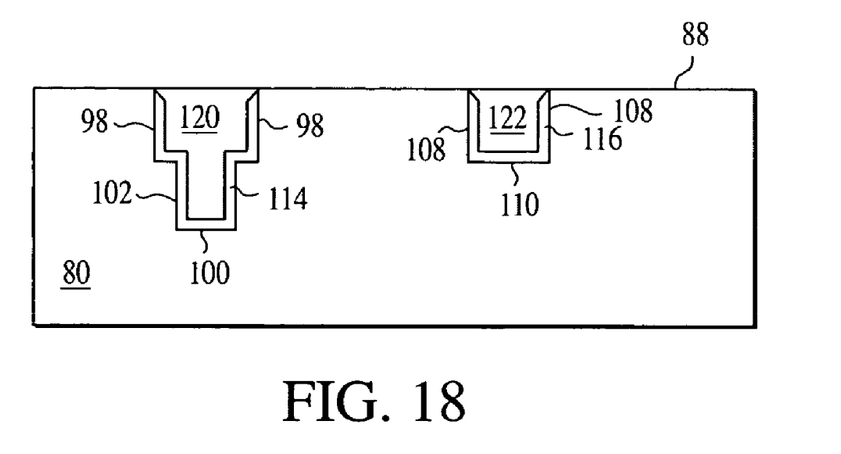

Following the planarization process, in FIG. 18 known wet chemical etching processes are applied to substrate 80 to remove hard mask layer 90, pad oxide layer 86, and portions of insulating material 118 extending above principal surface 88 of substrate 80. Upon completion of the wet chemical etching processes, a high-voltage isolation region 120 and a low voltage isolation region 122 are formed in substrate 80. In accordance with the invention, high voltage isolation region 120 electrically isolates high-voltage nodes formed in substrate 80.

Figure 19:
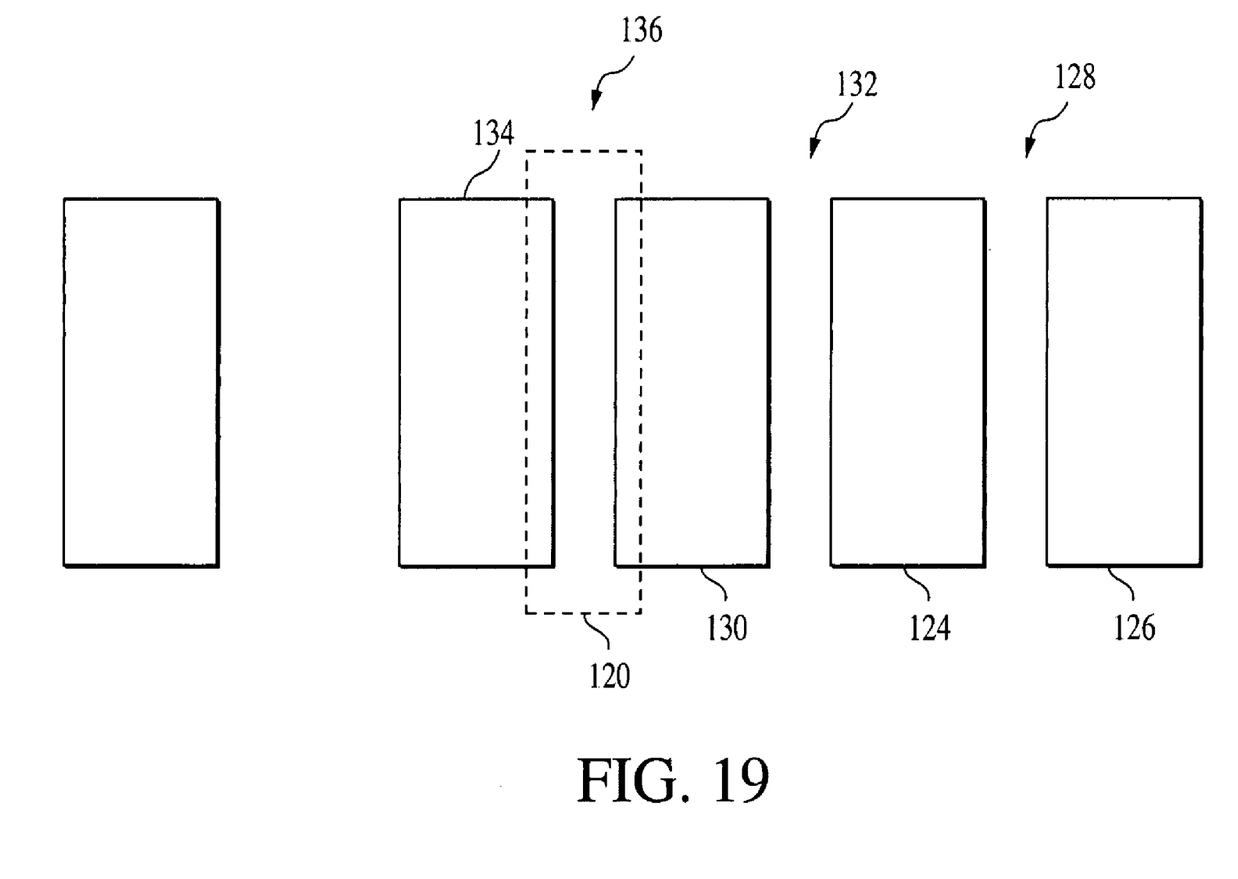
FIG. 19 is a plan view of high voltage and low voltage nodes in a substrate electrically isolated by trench isolation structure formed in accordance with the alternative embodiment of invention.

FIG. 19 is a plain view of high-voltage nodes and low-voltage nodes formed in substrate 80. As illustrated in FIG. 19, a pair of low-voltage nodes 124 and 126 reside adjacent to one another and separated by an intermediate space 128. A high-voltage node 130 resides in substrate 80 and is spaced apart from low-voltage node 124 by a space 132. A second high-voltage node 134 is spaced apart from high-voltage node 130 by a space 136.

In accordance with the invention, high-voltage isolation region 120 is positioned in space 136 to electrically isolate high-voltage node 130 from second high-voltage node 134. The outline of high-voltage isolation region 120 corresponds to the separation distance of sidewall spacers 96, or sidewall spacers 104, and also corresponds to the dimensions of bottom surface 100 of first trench 82. In accordance with the invention, the fabrication process for first trench 82 permits a high-degree of precision in the alignment of high-voltage node 130 and second high-voltage node 134. By using the process of the alternative embodiment, the high-voltage nodes can be fabricated to have a minimal separation distance. In particular, the isolation width is determined by the deposition thickness of sidewall spacer-forming layer 92, rather than the minimum alignment tolerance for forming a resist pattern. Accordingly, memory devices fabricated in accordance with the invention can have very small separation distances and precise lay-out tolerances.

In accordance with the invention, the isolation process can be used to isolate adjacent high-voltage nodes in which the high-voltage nodes are configured to support programming voltages and power supply voltages. Further, the adjacent high-voltage nodes are configured to be electrically contacted by electrical leads formed during fabrication of a memory device. For example, in one embodiment of the invention, high-voltage node 130 is configured to support a supply voltage, while second high-voltage node 134 is configured to support a programming voltage. Both high-voltage node 130 and high-voltage node 134 are configured to be electrically contacted by electrical leads to provide programming and supply voltages to the nodes. In one embodiment of the invention, low-voltage isolation region 122 fills space 128 between low-voltage nodes 124 and 126. Also, low-voltage isolation region 122 can be used to fill space 132 between high-voltage node 130 and low-voltage node 124. In accordance with process techniques known to those skilled in the art, transistors capacitors and other integrated circuit (IC) elements are formed on substrate 80.

Thus, it is apparent that there has been described, in accordance with the invention, a device having electrically isolated low voltage regions and high voltage regions, and a process for fabricating the device, that fully provides the advantages set forth above. Although the invention has been described and illustrated with reference to specific illustrative embodiments thereof, it is not intended that the invention be limited to those embodiments. Those skilled in the art will recognize that variations and modifications can be made without departing from the spirit of the invention. For example, fabrication technology, such as x-ray resist and etching processes, deep-UV resist processes, molecular beam deposition processes, and the like, can be used. It is therefore intended to include within the invention all such variations and modifications as fall within the scope of the appended claims and equivalence thereof.

The invention claimed is:

1. A process for fabricating a semiconductor device having high voltage regions and low voltage regions in a semiconductor substrate, the process comprising:
   forming trenches in the high voltage regions and in the low voltage regions;
   forming dielectric sidewall spacers in the trenches in the high voltage regions;
   forming a masking layer overlying the substrate,
   wherein the masking layer selectively exposes trenches residing between adjacent high voltage nodes in a high voltage region;
   etching deep portions in the exposed trenches using the sidewall spacers as an etching mask; and
   removing the masking layer and the sidewall spacers and filling the trenches with an insulating material.

2. The process of claim 1, wherein forming a masking layer comprises selectively exposing trenches between adjacent high voltage nodes that are configured to support voltages of differing magnitude.

3. The process of claim 2, wherein selectively exposing trenches between adjacent high voltage nodes comprises exposing first and second adjacent nodes, wherein the first adjacent node is configured to support a programming voltage and the second adjacent node is configured to support a supply voltage.

4. The process of claim 1, wherein forming dielectric sidewall spacers comprises depositing a silicon oxide layer on the semiconductor substrate and anisotropically etching the silicon oxide layer to form the sidewall spacers.

5. The process of claim 1, wherein filling the trenches with an insulating material comprises depositing a dielectric material to fill the trenches, and wherein the process further comprises removing excess dielectric material using a planarization process.

6. The process of claim 5 further comprising:
   forming a hard mask overlying the semiconductor substrate prior to forming trenches;
   removing the hard mask after performing the planarization process; and
   removing excess portions of the dielectric material.

7. The process of claim 1, wherein forming a masking layer comprises forming a layer of dielectric material.

8. The process of claim 1, wherein forming a masking layer comprises forming a composite layer comprising a dielectric material and a photoresist layer overlying the dielectric material.

9. The process of claim 1 further comprising forming dielectric sidewall spacers in the trenches in the low voltage regions.

10. The process of claim 9, wherein forming a masking layer comprises forming a layer of photoresist.

11. A process for fabricating isolation trenches in a substrate of a semiconductor device comprising:
    forming in the same process step a shallow portion of the trenches in a low voltage region and in a high voltage region of sufficient depth to isolate the low voltage region, but not of sufficient depth to isolate the high voltage region;
    forming sidewall spacers adjacent to sidewalls of the shallow portion in the high voltage region;
    forming a mask on the substrate that selectively exposes areas of the high voltage region having adjacent high voltage nodes; and
    etching the shallow portion using the sidewall spacers as an etch mask to form a deep portion of sufficient depth to electrically isolate the adjacent high voltage nodes.

12. The process of claim 11, wherein forming a mask comprises selectively exposing high voltage nodes that are configured to support voltages of differing magnitude.

13. The process of claim 12, wherein selectively exposing adjacent high voltage nodes comprises exposing first and second adjacent nodes, wherein the first adjacent node is configured to support a programming voltage and the second adjacent node is configured to support a supply voltage.

14. The process of claim 11 further comprising:
    removing the mask;
    filling the trenches with a dielectric material; and
    planarizing the dielectric material.

15. The process of claim 14 further comprising forming an electrical contact to the adjacent high voltage nodes.

16. A process for fabricating a semiconductor device comprising:
    providing a substrate having a principal surface and having low voltage regions and high voltage regions;
    etching the substrate to form recesses in the low voltage regions and in the high voltage regions,
    wherein the recesses have sidewalls extending from a floor to the principal surface;
    forming sidewall spacers adjacent to the sidewalls of the recesses,
    wherein the sidewall spacer exposes a portion of the floor that substantially corresponds to an isolation width between adjacent high voltage regions;
    masking the substrate to cover the low voltage regions and to expose selected portions of the high voltage regions;
    etching the recesses in the high voltage regions to form a deep portion in the floor using the sidewall spacers as an etch mask;
    removing the sidewall spacers and forming a dielectric liner in the recesses; and
    filling the recesses with an electrical insulating material to form low voltage isolation regions and high voltage isolation regions.

17. The process of claim 16 further comprising planarizing the substrate and forming high voltage transistors in the high voltage region and forming low voltage transistors in the low voltage regions.

18. The process of claim 16, wherein masking the substrate to expose selected portions of the high voltage regions comprises exposing adjacent first and second high voltage nodes, wherein the first high voltage node is configured to support a supply voltage and the second high voltage node is configured to support a programming voltage.

19. The process of claim 16, wherein masking the substrate comprises one of forming a composite layer comprising a dielectric material and a photoresist layer overlying the dielectric material.

20. The process of claim 16 further comprising forming dielectric sidewall spacers in the trenches in the low voltage regions.

* * * * *